United States Patent
Shigematsu et al.

(10) Patent No.: US 11,838,043 B2
(45) Date of Patent: Dec. 5, 2023

(54) FILTER CIRCUIT MODULE, FILTER CIRCUIT ELEMENT, FILTER CIRCUIT, AND COMMUNICATION APPARATUS

(71) Applicant: Murata Manufacturing Co., Ltd., Nagaokakyo (JP)

(72) Inventors: Satoshi Shigematsu, Nagaokakyo (JP); Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 354 days.

(21) Appl. No.: 17/371,185

(22) Filed: Jul. 9, 2021

(65) Prior Publication Data

US 2021/0336648 A1   Oct. 28, 2021

Related U.S. Application Data

(63) Continuation of application No. PCT/JP2020/002322, filed on Jan. 23, 2020.

(30) Foreign Application Priority Data

Feb. 22, 2019   (JP) .................. 2019-030410

(51) Int. Cl.
*H04B 1/10* (2006.01)
*H04B 1/40* (2015.01)
(Continued)

(52) U.S. Cl.
CPC .............. *H04B 1/40* (2013.01); *H03H 7/03* (2013.01); *H03H 7/09* (2013.01)

(58) Field of Classification Search
CPC .............. H04B 2001/1063; H04B 1/40; H03H 2003/0414; H03H 7/18; H03H 9/46
See application file for complete search history.

(56) References Cited

U.S. PATENT DOCUMENTS 9,692,324 B2 *  6/2017  Bieler ............... A61M 5/14276
9,774,269 B2 *  9/2017  Matsubara ........ H02M 3/33584
(Continued)

FOREIGN PATENT DOCUMENTS

JP   2002-100947 A   4/2002
WO   2014/109111 A1   7/2014
(Continued)

OTHER PUBLICATIONS

Official Communication issued in International Patent Application No. PCT/JP2020/002322, dated Mar. 17, 2020.

*Primary Examiner* — Tuan Pham
(74) *Attorney, Agent, or Firm* — Keating & Bennett, LLP

(57) ABSTRACT

A filter circuit module includes a filter circuit element, a circuit board with the filter circuit element mounted thereon, and a first inductor. The filter circuit element includes a resonant circuit capacitor defining a portion of an LC parallel resonant circuit, and a phase-shift circuit. The circuit board includes a second inductor. A primary coil and a secondary coil of the phase-shift circuit are overlapped with the second inductor, viewed in a direction of a winding axis. The resonant circuit capacitor is closer to a mounting surface on which the filter circuit element is mounted on the circuit board, compared with the primary coil and the secondary coil. The resonant circuit capacitor includes a capacitor electrode covering a coil opening of the primary coil and a coil opening of the secondary coil, viewed in the direction of the winding axis.

18 Claims, 14 Drawing Sheets

(51) Int. Cl.
*H03H 7/03* (2006.01)
*H03H 7/09* (2006.01)

(56) References Cited

U.S. PATENT DOCUMENTS

| | | | |
|---|---|---|---|
| 9,819,324 B2* | 11/2017 | Desclos | ............... H03H 7/0161 |
| 2015/0318890 A1 | 11/2015 | Uejima | |
| 2017/0117868 A1 | 4/2017 | Ishizuka et al. | |
| 2018/0069524 A1 | 3/2018 | Ishizuka | |

FOREIGN PATENT DOCUMENTS

| | | |
|---|---|---|
| WO | 2016/114181 A1 | 7/2016 |
| WO | 2017/002661 A1 | 1/2017 |

\* cited by examiner

FILTER CIRCUIT MODULE, FILTER CIRCUIT ELEMENT, FILTER CIRCUIT, AND COMMUNICATION APPARATUS

CROSS REFERENCE TO RELATED APPLICATIONS

This application claims the benefit of priority to Japanese Patent Application No. 2019-030410 filed on Feb. 22, 2019 and is a Continuation Application of PCT Application No. PCT/JP2020/002322 filed on Jan. 23, 2020. The entire contents of each application are hereby incorporated herein by reference.

BACKGROUND OF THE INVENTION

1. Field of the Invention

The present invention relates to a filter circuit module and a filter circuit element each including a phase-shift circuit. In addition, the present invention relates to a filter circuit including a phase-shift circuit and a communication apparatus including the filter circuit.

2. Description of the Related Art

Adverse effects of 2.4-GHz band interfering waves on communication modules for cellular networks have emerged in recent years because of increasing opportunities for concurrent use of wireless local area networks (LANs) using the 2.4-GHz band and the cellular networks. Accordingly, it is necessary to provide measures for the 2.4-GHz band interfering waves. For example, International Publication No. 2014/109111 discloses a communication module including a notch filter illustrated in FIG. 22 in order to suppress noise in a specific frequency band.

In the example illustrated in FIG. 22, a radio-frequency switch module 900 includes a switch integrated circuit (IC) 92, a phase adjustment circuit 93, a filter 94, and an antenna matching circuit 91. The filter 94 includes an LC parallel resonant circuit including a filter capacitor Ct and a filter inductor Lt. The filter 94 is provided in series between an individual connection terminal Pa and an external connection terminal Po. The filter 94 serves as a notch filter, and the attenuation pole frequency of the filter 94 is set, for example, so as to be equal to or substantially equal to the frequency of a second harmonic signal of a radio-frequency signal input through the external connection terminal Po.

However, in the structure illustrated in FIG. 22 in which the LC parallel resonant circuit (the filter 94) is provided in series to a transmission line, the transmission loss of signals is increased due to the LC parallel resonant circuit.

SUMMARY OF THE INVENTION

Preferred embodiments of the present invention provide filter circuit modules, filter circuit elements, filter circuits, and communication apparatuses, which are each able to improve the attenuation of signals without increasing the transmission loss of the signals.

A filter circuit module according to a preferred embodiment of the present invention includes a filter circuit element, which is a multilayer body including multiple base material layers including a base material layer with a conductive pattern provided thereon, a circuit board with the filter circuit element mounted thereon, and a first inductor. The filter circuit element includes a resonant circuit capacitor, which is a portion of an LC parallel resonant circuit, and a phase-shift circuit. The circuit board is provided with a second inductor. The phase-shift circuit includes a primary coil, a secondary coil, and a capacitor-between-input-and-output. The primary coil is magnetically coupled to the secondary coil. The LC parallel resonant circuit includes the second inductor and the resonant circuit capacitor connected in parallel to the second inductor. The capacitor-between-input-and-output is connected between a first end of the primary coil and a first end of the secondary coil. The first end of the primary coil is connected to the first inductor. A second end of the primary coil is connected to a second end of the secondary coil. A first end of the resonant circuit capacitor is connected to the first end of the secondary coil. A second end of the resonant circuit capacitor is connected to the second end of the secondary coil. The second inductor is provided in the circuit board. The primary coil and the secondary coil are overlapped with the second inductor, viewed in a laminated direction of the multilayer body. The resonant circuit capacitor is closer to a mounting surface on which the filter circuit element is mounted on the circuit board, compared with the primary coil and the secondary coil. The resonant circuit capacitor includes multiple capacitor electrodes and the multiple capacitor electrodes include a capacitor electrode covering a coil opening of the primary coil and a coil opening of the secondary coil, viewed in the laminated direction.

A filter circuit element according to a preferred embodiment of the present invention includes a multilayer body including multiple base material layers including a base material layer with a conductive pattern provided thereon and includes an LC parallel resonant circuit and a phase-shift circuit. The phase-shift circuit includes a primary coil, a secondary coil, and a capacitor-between-input-and-output. The primary coil is magnetically coupled to the secondary coil. The LC parallel resonant circuit includes a resonant circuit inductor and a resonant circuit capacitor, which are connected in parallel to each other. The capacitor-between-input-and-output is connected between a first end of the primary coil and a first end of the secondary coil. A second end of the primary coil is connected to a second end of the secondary coil. A first end of the resonant circuit capacitor is connected to the first end of the secondary coil. A second end of the resonant circuit capacitor is connected to the second end of the secondary coil. The resonant circuit inductor includes a coil with a winding axis. The primary coil and the secondary coil are overlapped with the resonant circuit inductor, viewed in a direction of the winding axis. The resonant circuit capacitor is between the coil of the resonant circuit inductor and the primary coil and the secondary coil. The resonant circuit capacitor includes multiple capacitor electrodes and the multiple capacitor electrodes include a capacitor electrode covering a coil opening of the primary coil and a coil opening of the secondary coil, viewed in the direction of the winding axis.

According to preferred embodiments of the present invention, it is possible to provide filter circuit modules, filter circuit elements, filter circuits, and communication apparatuses, which are each able to improve the attenuation of signals without increasing the transmission loss of the signals.

The above and other elements, features, steps, characteristics and advantages of the present invention will become more apparent from the following detailed description of the preferred embodiments with reference to the attached drawings.

US 11,838,043 B2

DETAILED DESCRIPTION OF THE PREFERRED EMBODIMENTS

Figure 1:
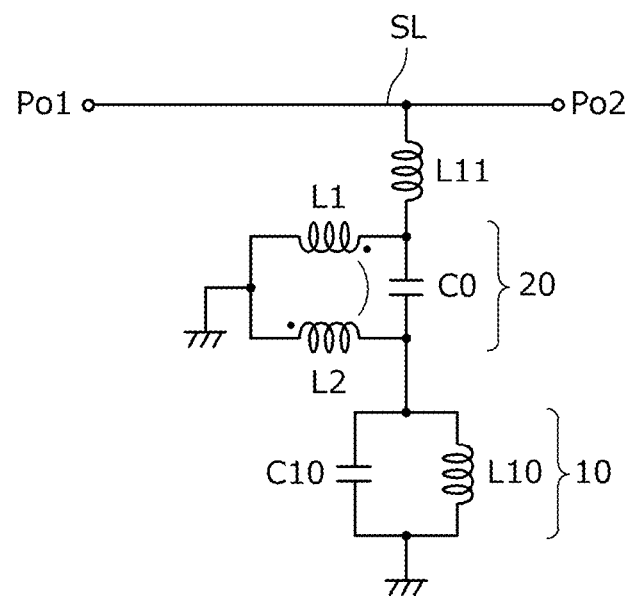
FIG. 1 is a circuit diagram of a filter circuit module 201 according to a first preferred embodiment of the present invention.

Preferred embodiments of the present invention will be described herein with reference to the drawings using some specific examples. The same reference numerals and letters denote the same components or corresponding in the respective drawings. Although the preferred embodiments are indicated for convenience of description in consideration of the ease of description or understanding of the points, partial replacement or combination of the components indicated in different preferred embodiments is available. A description of matters common to a first preferred embodiment is omitted and only points different from the first preferred embodiment are described in a second preferred embodiment and the subsequent preferred embodiments. The same or similar advantageous effects and advantages of the same components are not successively described for the respective preferred embodiments.

First Preferred Embodiment

FIG. 1 is a circuit diagram of a filter circuit module 201 according to a first preferred embodiment of the present invention. The filter circuit module 201 includes a shunt-connected circuit that is shunt-connected between a signal line SL between input-output ports Po1-Po2 and ground. The shunt-connected circuit includes a first inductor L11, a phase-shift circuit 20, and an LC parallel resonant circuit 10.

The LC parallel resonant circuit 10 is a parallel connection circuit (LC tank circuit) including a second inductor L10 and a resonant circuit capacitor C10. The resonant frequency of the LC parallel resonant circuit 10 is set to, for example, about 2.4 GHz, which is one of communication frequency bands used in the wireless LAN.

A capacitor-between-input-and-output C0 is connected between a first end of a primary coil L1 and a first end of a secondary coil L2. A second end of the primary coil L1 is connected to a second end of the secondary coil L2, a first end of the resonant circuit capacitor C10 is connected to the first end of the secondary coil L2, and a second end of the resonant circuit capacitor C10 is connected to the ground which the second end of the secondary coil L2 is connected to.

Figure 2:
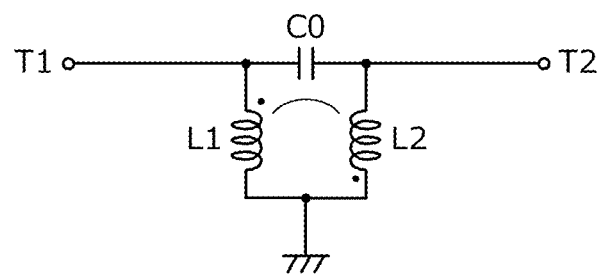
FIG. 2 is a circuit diagram of a phase-shift circuit 20.

FIG. 2 is a circuit diagram of the phase-shift circuit 20. The phase-shift circuit 20 includes a transformer including the primary coil L1 and the secondary coil L2, which are magnetically coupled to each other, and the capacitor-between-input-and-output C0.

Figure 3A:
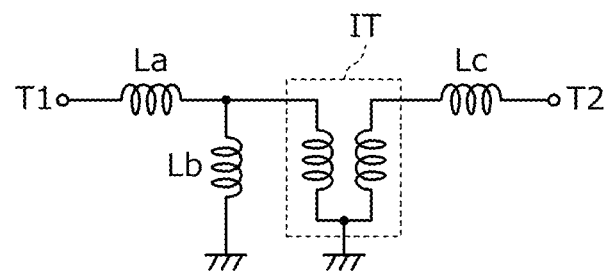
FIGS. 3A and 3B are equivalent circuit diagrams of a transformer.
Figure 3B:
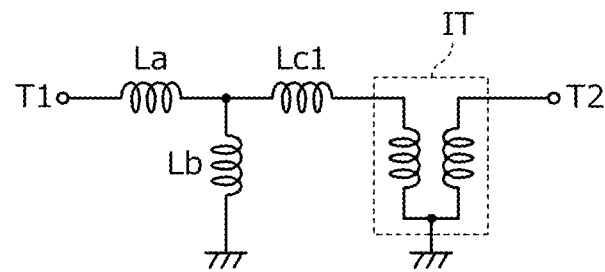

FIGS. 3A and 3B are equivalent circuit diagrams of the transformer. The equivalent circuit of the transformer can be represented in several forms. In the representation in FIG. 3A, the equivalent circuit of the transformer is represented by an ideal transformer IT, an inductor La connected in series at the primary side of the ideal transformer IT, an inductor Lb connected in parallel at the primary side of the ideal transformer IT, and an inductor Lc connected in series at the secondary side of the ideal transformer IT.

In the representation in FIG. 3B, the equivalent circuit of the transformer is represented by the ideal transformer IT, two inductors La and Lc1 connected in series at the primary side of the ideal transformer IT, and the inductor Lb connected in parallel at the primary side of the ideal transformer IT.

The inductances of the inductors La, Lb, Lc and Lc1 have the following relationship where the transformer ratio of the transformer is denoted by $1:\sqrt{(L2/L1)}$, the coupling coefficient of the primary coil L1 and the secondary coil L2 (refer to FIG. 1) is denoted by k, the inductance of the primary coil L1 is denoted by L1, and the inductance of the secondary coil L2 is denoted by L2:

La: L1(1-k)
Lb: k*L1
Lc: L2(1-k)
Lc1: L1 (1-k)

The transformer ratio of the ideal transformer IT is the ratio of the number of turns of the primary coil L1 to the number of turns of the secondary coil L2.

Since the transformer is configured so that the coupling coefficient k of the primary coil L1 and the secondary coil L2 is smaller than one, a series inductance (leakage inductance) component occurs, in addition to a parallel inductance (exciting inductance) component.

Figure 4:
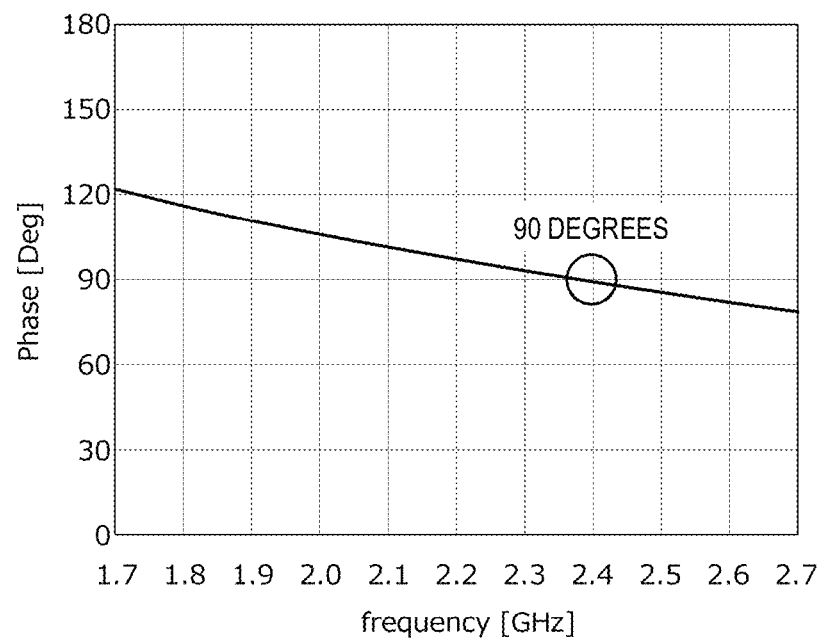
FIG. 4 is a graph showing a frequency characteristic of the amount of phase shift of the phase-shift circuit 20 according to the first preferred embodiment of the present invention.

FIG. 4 is a graph showing a frequency characteristic of the amount of phase shift of the phase-shift circuit 20 of the present preferred embodiment. Referring to FIG. 4, the horizontal axis represents frequency and the vertical axis represents the amount of phase shift. In this example, the amount of phase shift is about 90° at a frequency of 2.4 GHz.

As illustrated in FIG. 1, the shunt-connected circuit shunt-connected between the signal line SL and the ground includes a series circuit of the LC parallel resonant circuit 10 and the phase-shift circuit 20 and the resonant frequency of the LC parallel resonant circuit 10 is set to about 2.4 GHz, which is a desired frequency to be trapped. In such a case, although the shunt-connected circuit seems to be opened from the signal line at the frequency of about 2.4 GHz if the phase-shift circuit 20 is not provided, the shunt-connected circuit seems to be short-circuited from the signal line because the phase of the phase-shift circuit 20 is shifted by about 90° at the frequency of 2.4 GHz and a 2.4-GHz signal (noise) is grounded. Accordingly, the shunt-connected circuit defines and functions as a 2.4-GHz trap filter.

In the present preferred embodiment, since the LC tank circuit is not provided in series with the signal line, almost no transmission loss occurs, for example, in a 2-GHz (about 1.71 GHz to about 1.91 GHz) band of fundamental waves.

In addition, in the present preferred embodiment, for example, the harmonic components of the fundamental waves, for example, third harmonic components (about 5.13 GHz to about 5.73 GHz) are attenuated by the first inductor L11, which is shunt-connected. Accordingly, not only desired frequency components are capable of being trapped but also the harmonic components of a desired signal are capable of being attenuated in the present preferred embodiment.

Figure 5:
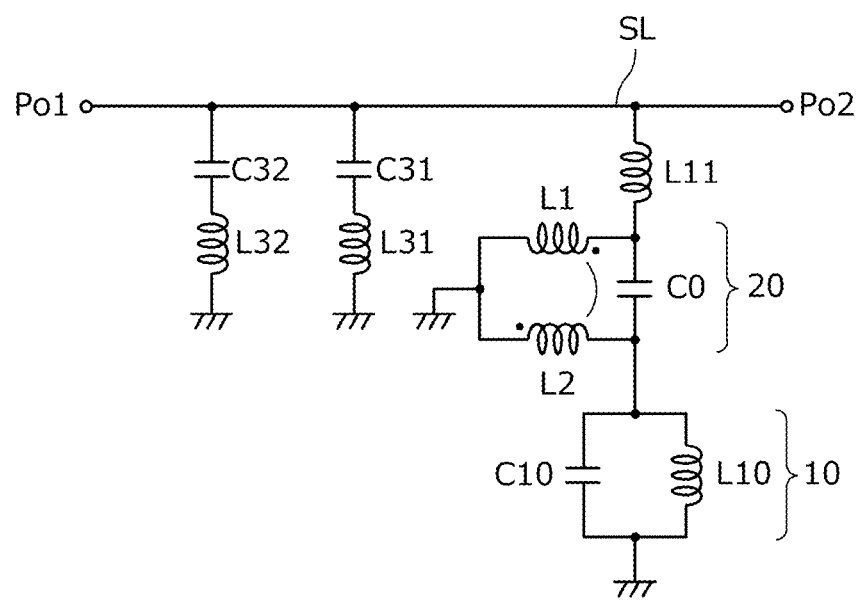
FIG. 5 is a diagram illustrating a filter circuit element 101 defining a portion of a filter circuit module 201M.

Next, a modification of the present preferred embodiment is described. FIG. 5 is a circuit diagram of a filter circuit module 201M according to the modification of the first preferred embodiment. The filter circuit module 201M results from the addition of a first LC series resonant circuit including a capacitor C31 and an inductor L31 and a second LC series resonant circuit including a capacitor C32 and an inductor L32 to the filter circuit module 201 illustrated in FIG. 1.

Figure 21:
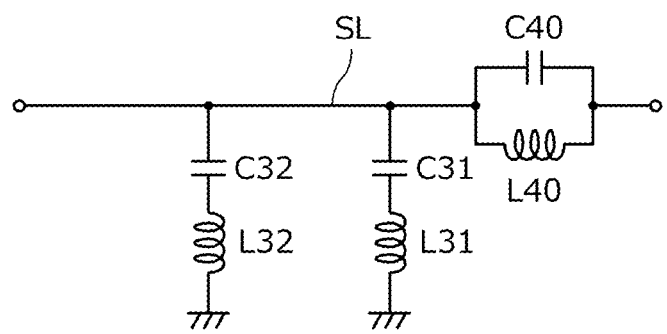
FIG. 21 is a circuit diagram of the filter circuit module of the comparative example.
Figure 22:
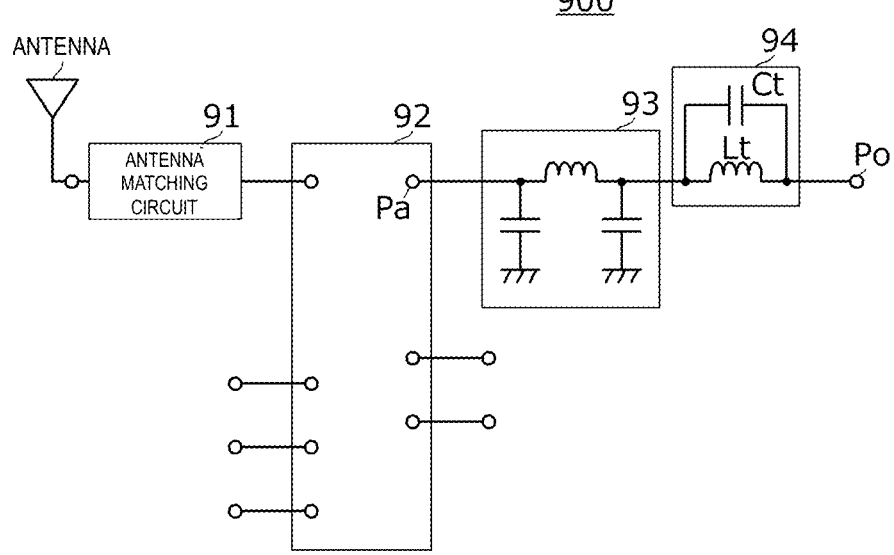
FIG. 22 is a circuit diagram of a communication module in the related art, which includes a notch filter to reduce or prevent noise in a specific frequency band.

The circuit of a filter circuit module as a comparative example is illustrated in FIG. 21. This filter circuit module traps desired frequency components and attenuates the harmonic components of a desired signal. Referring to FIG. 21, a capacitor C40 and an inductor L40 define an LC parallel resonant circuit, the capacitor C31 and the inductor L31 define the first LC series resonant circuit, and the capacitor C32 and the inductor L32 define the second LC series resonant circuit. The LC parallel resonant circuit is connected in series to the signal line SL, and the first LC series resonant circuit and the second LC series resonant circuit are shunt-connected between the signal line SL and the ground. The LC parallel resonant circuit traps a desired frequency and the first LC series resonant circuit and the second LC series resonant circuit attenuate the desired harmonic components of a signal. The two LC series resonant circuits are used to support the frequency width of the harmonic components.

Figure 6A:
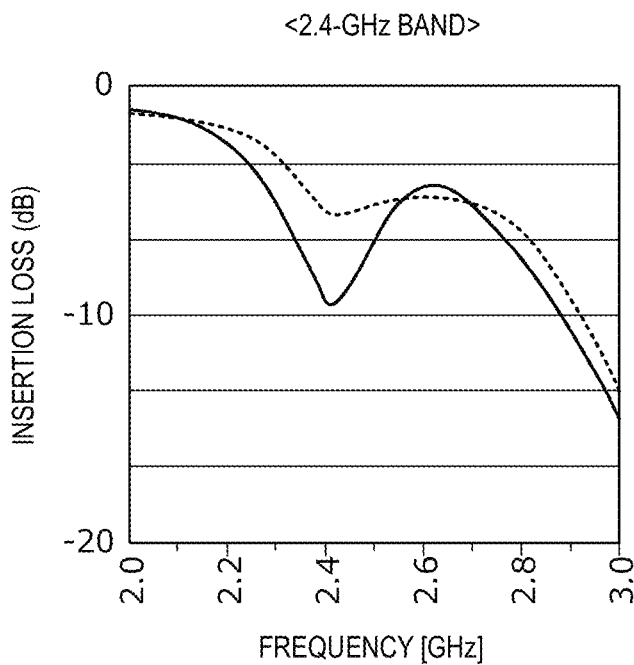
FIG. 6A is a graph showing insertion loss characteristics in a 2.4-GHz band in the filter circuit module 201M illustrated in FIG. 5 and a filter circuit module of a comparative example illustrated in FIG. 21.
Figure 6B:
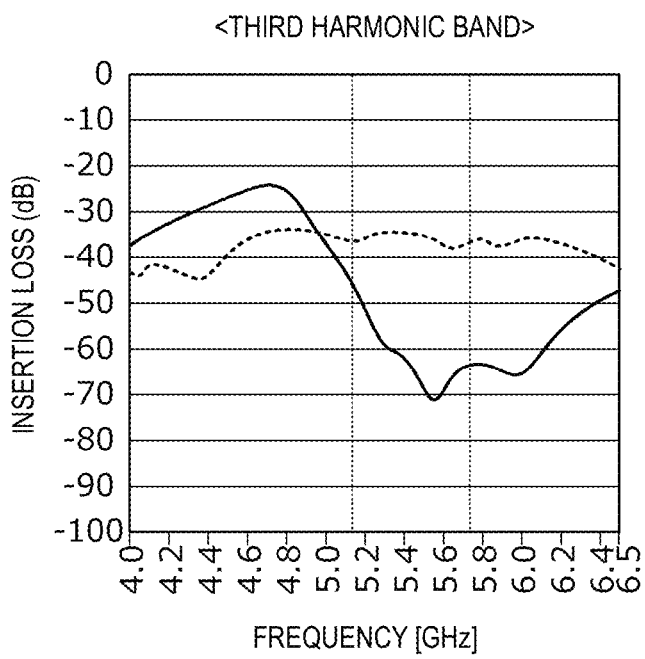
FIG. 6B is a graph showing the insertion loss characteristics in a frequency band of third harmonic waves in the filter circuit module 201M and the filter circuit module of the comparative example.

FIG. 6A is a graph showing insertion loss characteristics in the 2.4-GHz band in the filter circuit module 201M illustrated in FIG. 5 and the filter circuit module of the comparative example illustrated in FIG. 21. FIG. 6B is a graph showing the insertion loss characteristics in the frequency band of the third harmonic waves in the filter circuit module 201M and the filter circuit module of the comparative example. Referring to FIGS. 6A and 6B, solid lines indicate the characteristics of the filter circuit module 201M and broken lines indicate the characteristics of the filter circuit module of the comparative example.

As shown in FIGS. 6A and 6B, the insertion loss in a desired frequency (about 2.4 GHz) band in the present preferred embodiment is greater than that in the comparative example and the filter circuit module 201M of the present preferred embodiment provides a more effective trap filter, compared with the filter circuit module of the comparative example. Also for the band of the desired harmonic waves (the third harmonic waves) (the frequency band indicated by two thin lines in FIG. 6B), large attenuation is ensured in the present preferred embodiment, compared with that in the comparative example. In addition, in the configuration illustrated in FIG. 5, when the primary coil L1, the secondary coil L2, the capacitor-between-input-and-output C0, and the resonant circuit capacitor C10 are provided as a single component, the second inductor L10 is provided in a substrate, and the first inductor L11 is provided by a wiring pattern (exemplified below), the number of the mounted components is smaller than that in the comparative example illustrated FIG. 21 by one. Furthermore, when the above characteristics of the comparative example illustrated in FIG. 21 is made equal or substantially equal to the characteristics of the circuit illustrated in FIG. 5, the difference in the number of the mounted components is two or more. Accordingly, the configuration described in the present preferred embodiment is capable of being reduced in size along with the reduction in the number of the components (elements), compared with the configuration of the comparative example.

Figure 7:
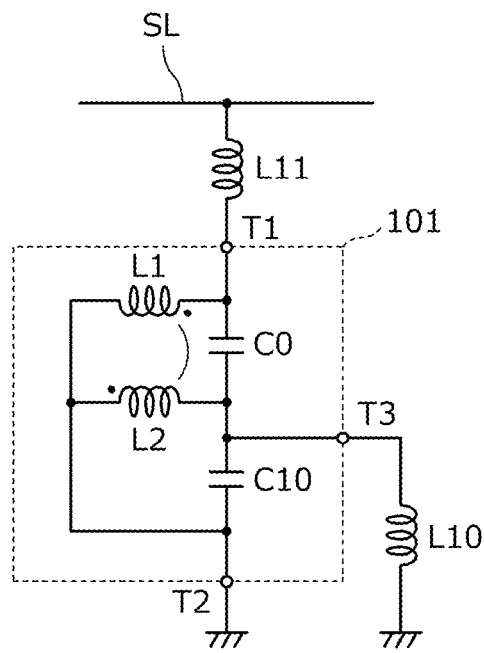
FIG. 7 is a diagram illustrating the filter circuit element 101 defining a portion of the filter circuit module 201.

FIG. 7 is a diagram illustrating a filter circuit element 101 defining a portion of the filter circuit module 201. In the filter circuit element 101, the primary coil L1, the secondary coil L2, the capacitor-between-input-and-output C0, and the resonant circuit capacitor C10 are provided as a single component.

Figure 8:
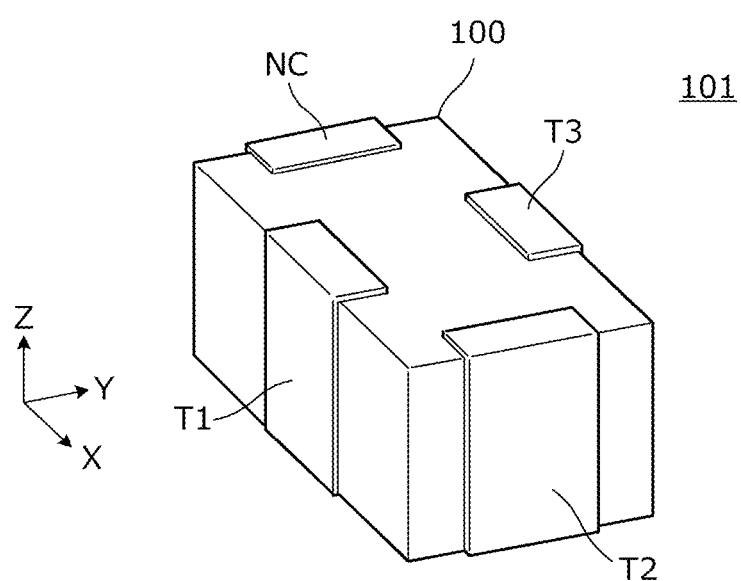
FIG. 8 is an external perspective view of the filter circuit element 101.

FIG. 8 is an external perspective view of the filter circuit element 101. The filter circuit element 101 includes a rectangular or substantially rectangular parallelepiped multilayer body 100 in which multiple base material layers including a base material layer with a conductive pattern provided thereon are laminated. Input-output terminals T1, T2, and T3 and a free terminal NC are provided on outer surfaces of the multilayer body 100.

Figure 9A:
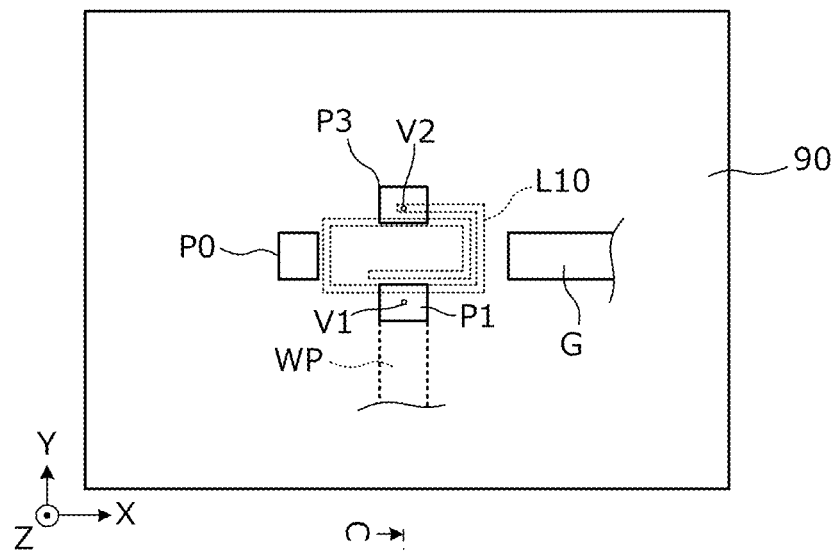
FIG. 9A is a plan view of a circuit board 90, which indicates the configuration of a mounting portion of the filter circuit element 101.
Figure 9B:
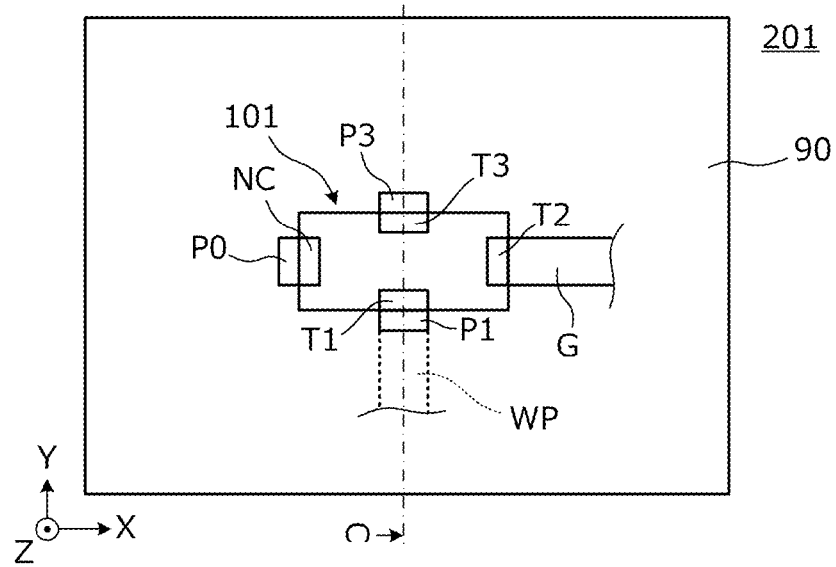
FIG. 9B is a plan view of the filter circuit module 201 having the filter circuit element 101 mounted on the circuit board 90.
Figure 9C:
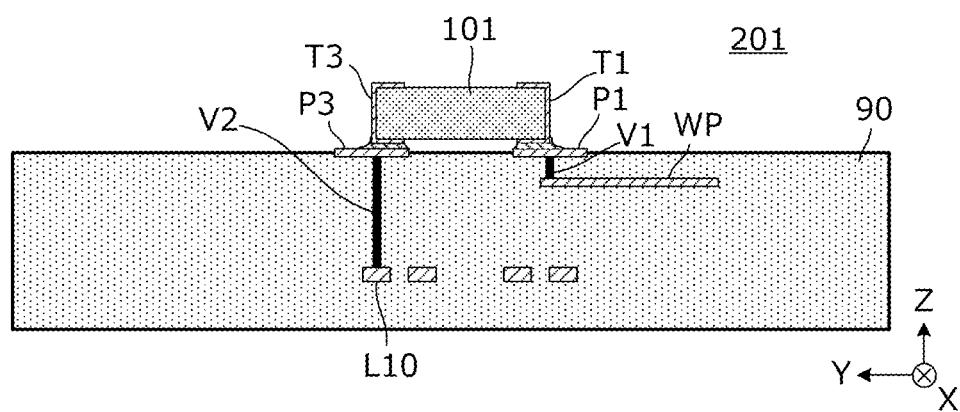
FIG. 9C is a vertical cross-sectional view of the filter circuit module 201.

FIG. 9A is a plan view of a circuit board 90, which indicates the configuration of a mounting portion of the filter circuit element 101. FIG. 9B is a plan view of the filter circuit module 201 with the filter circuit element 101 mounted on the circuit board 90. FIG. 9C is an enlarged vertical cross-sectional view taken along the C-C line in FIG. 9B.

A ground electrode G, mounting pads P0, P1, and P3, and the like, for example, are provided on the top surface of the circuit board 90. A wiring pattern WP, the second inductor L10, and the like, for example, are provided in the circuit board 90. The second inductor L10 includes a rectangular or substantially rectangular spiral conductive pattern. One end of the second inductor L10 is connected to the mounting pad P3 via an interlayer connection conductor V2 and the other end of the second inductor L10 is connected to a ground conductor in the circuit board 90. The wiring pattern WP is connected to the signal line SL illustrated in FIG. 7.

As illustrated in FIG. 9B, in a state in which the filter circuit element 101 is mounted on the circuit board 90, the input-output terminal T1 is connected to the mounting pad P1, the input-output terminal T3 is connected to the mounting pad P3, the input-output terminal T2 is connected to the ground electrode G, and the free terminal NC is connected to the mounting pad P0. As illustrated in FIG. 9C, the input-output terminal T1 is connected to an end portion of the wiring pattern WP via an interlayer connection conductor V1 provided in the circuit board 90. The mounting pad P3 is connected to one end of the second inductor L10 provided in the circuit board 90 via the interlayer connection conductor V2 provided in the circuit board 90. In the circuit board 90, the wiring pattern WP is provided on a plane different from that of the second inductor L10. This increases the degree of freedom of design of the second inductor L10.

The parasitic inductance of the wiring pattern WP defines the first inductor L11 illustrated in FIG. 1 and FIG. 7. The first inductor L11 may be provided by mounting a chip inductor on the circuit board 90.

According to the present preferred embodiment, since the second inductor L10 is provided in the circuit board 90, that is, it is not necessary to include the second inductor L10 in the filter circuit element 101, it is possible to lower the profile of the height in a laminated direction of the filter circuit element 101. Alternatively, it is possible to reduce the area where the filter circuit element 101 is provided. In addition, since the second inductor L10 is capable of being provided in a relatively wide area without using many layers, it is possible to accurately set the inductance of the second inductor L10 with a small variation.

Figure 10:
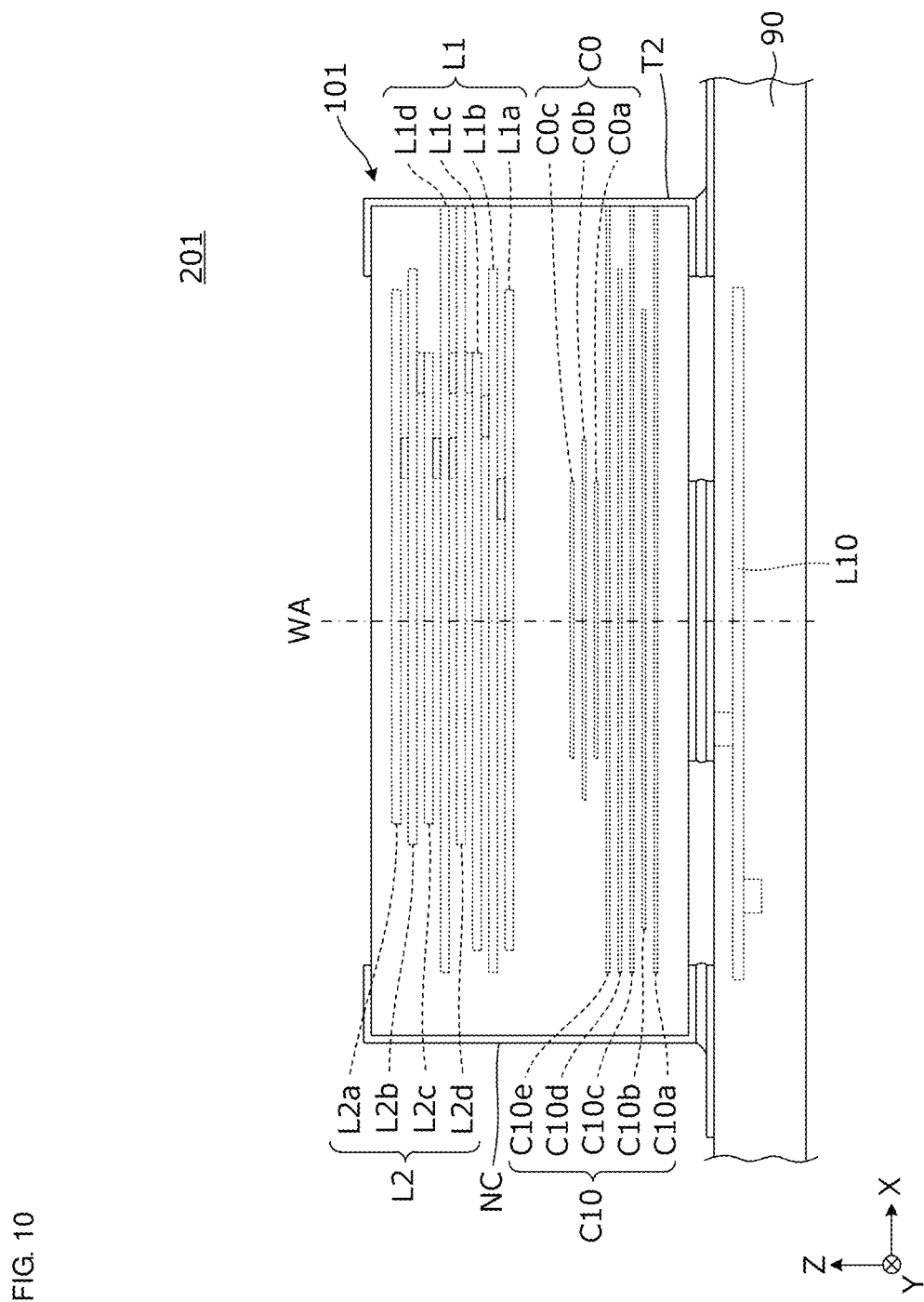
FIG. 10 is a front view of the filter circuit module 201.
Figure 11:
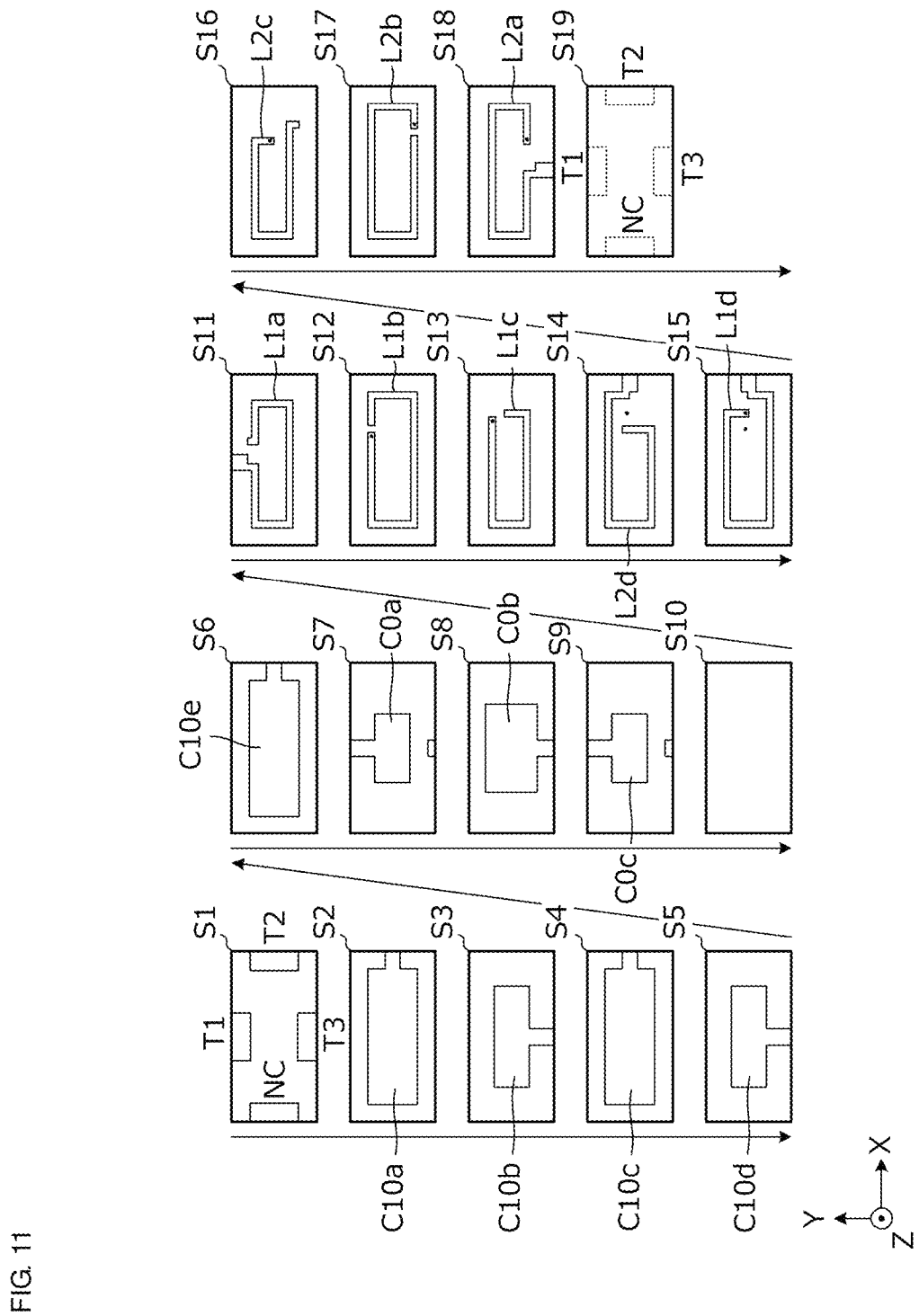
FIG. 11 is a bottom view of the respective base materials of the filter circuit element 101.

FIG. 10 is a front view of the filter circuit module 201. FIG. 11 is a bottom view of the respective base materials of the filter circuit element 101.

The filter circuit element 101 includes multiple insulating base materials S1 to S19. The base materials are the same as base material layers in preferred embodiments of the present invention. The base materials S1 to S19 are laminated to define the multilayer body 100. In other words, the base materials S1 to S19 define the base material layers in a laminated state. The base materials S1 to S19 are insulating sheets, for example, ceramic green sheets made of non-magnetic ceramics, such as low temperature co-fired ceramics (LTCC), in a state before the base materials S1 to S19 are laminated and subjected to pressure bonding. Various conductive patterns are provided on the base materials S1 to S19. The "various conductive patterns" include not only the conductive patterns provided on the surfaces of the base materials but also the interlayer connection conductors. The "interlayer connection conductors" include not only via conductors but also end surface electrodes provided on the end surfaces of the multilayer body 100.

The various conductive patterns are made of a conductive material having low specific resistance, which mainly include, for example, Ag or Cu. When the base material layers are made of ceramics, the base material layers are formed, for example, through screen printing of conductive paste mainly including Ag or Cu and firing.

When the base materials S1 to S19 are the ceramic green sheets, the base materials S1 to S19a are laminated and fired to form a ceramic mother board and the ceramic mother board is cut into pieces to manufacture many multilayer bodies 100. Then, the end surface electrodes are provided on the outer surfaces of the multilayer body 100 to define the filter circuit element 101.

The insulating base materials are not limited to being made of LTCC and may be formed by repeating application of insulating paste mainly including glass through the screen printing, for example. In this case, the various conductive patterns are formed by a photolithographic process, for example. When the insulating base materials are made of glass, the parasitic capacitance of the coils is capable of being reduced or prevented because glass has a permittivity lower than that of ceramics. Accordingly, it is possible to reduce the shift in the resonant frequency of the LC parallel resonant circuit to trap a desired frequency with higher accuracy.

The base material S1 corresponds to the bottom surface of the multilayer body 100 (the mounting surface on which the filter circuit element 101 is mounted). The input-output terminals T1, T2, and T3 and the free terminal NC are provided on the base material S1.

Capacitor electrodes C10a, C10b, C10c, C10d, and C10e defining the resonant circuit capacitor C10 are provided on the base materials S2 to S6, respectively. The capacitor electrodes C10a, C10c, and C10e are connected to the input-output terminal T2 and the capacitor electrodes C10b and C10d are connected to the input-output terminal T3.

Capacitor electrodes C0a, C0b, and C0c of the capacitor-between-input-and-output C0 are provided on the base materials S7 to S9, respectively. The capacitor electrodes C0a and C0c are connected to the input-output terminal T1 and the capacitor electrode C0b is connected to the input-output terminal T3.

Conductive patterns L1a, L1b, L1c, and L1d of the primary coil L1 are provided on the base materials S11, S12, S13, and S15, respectively. Referring to FIG. 11, the interlayer connection conductors are represented by black circles. A first end of the conductive pattern L1a is connected to the input-output terminal T1, a second end of the conductive pattern L1a is connected to a first end of the conductive pattern L1b via the interlayer connection conductor, a second end of the conductive pattern L1b is connected to a first end of the conductive pattern L1c via the interlayer connection conductor, a second end of the conductive pattern L1c is connected to a first end of the conductive pattern L1d via the interlayer connection conductor, and a second end of the conductive pattern L1d is connected to the input-output terminal T2.

Conductive patterns L2a, L2b, L2c, and L2d of the secondary coil L2 are provided on the base materials S18, S17, S16, and S14, respectively. A first end of the conductive pattern L2a is connected to the input-output terminal T3, a second end of the conductive pattern L2a is connected to a first end of the conductive pattern L2b via the interlayer connection conductor, a second end of the conductive pattern L2b is connected to a first end of the conductive pattern L2c via the interlayer connection conductor, a second end of the conductive pattern L2c is connected to a first end of the conductive pattern L2d via the interlayer connection conductor, and a second end of the conductive pattern L2d is connected to the input-output terminal T2.

As represented in FIG. 10 and FIG. 11, each of the primary coil L1 and the secondary coil L2 has a shape wound around a winding axis WA and a winding axis direction of the coil conductor is the Z-axis direction in the axes illustrated in FIG. 10 in each of the primary coil L1 and the secondary coil L2. The conductive pattern L2d of the secondary coil is sandwiched between the conductive patterns L1c and L1d of the primary coil in the laminated direction, and the conductive pattern L1d of the primary coil is sandwiched between the conductive patterns L2d and L2c of the secondary coil in the laminated direction. With this configuration, it is possible to effectively increase the coupling between the primary coil and the secondary coil.

Figure 12:
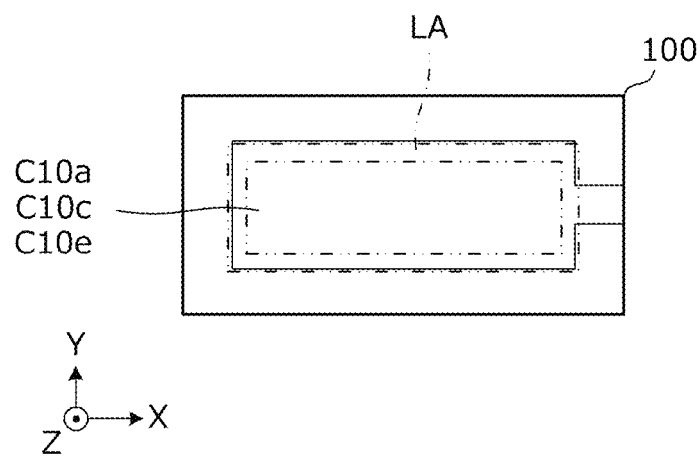
FIG. 12 is a diagram illustrating the magnitude relationship and the positional relationship between conductive patterns of a primary coil L1 and a secondary coil L2 and electrodes of a resonant circuit capacitor C10.
Figure 13:
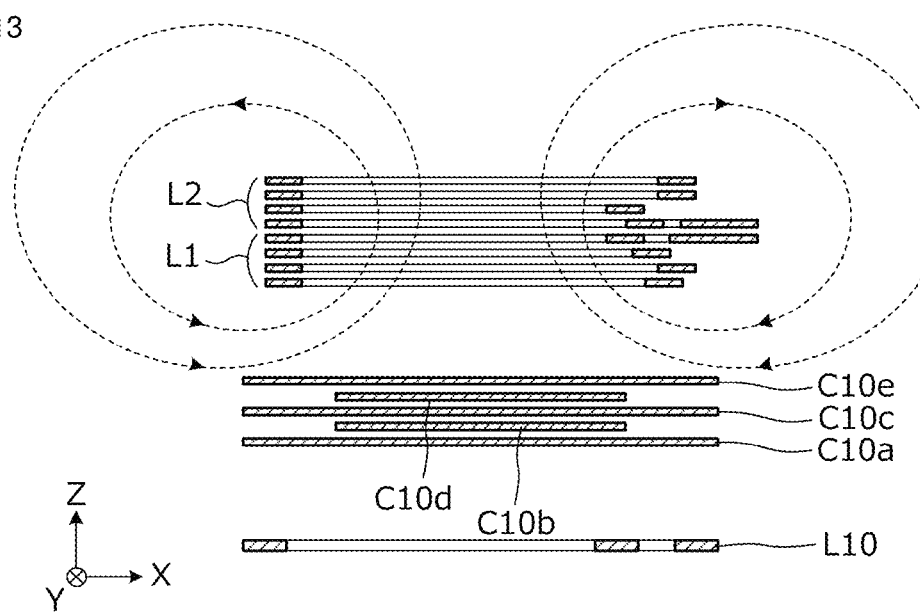
FIG. 13 is a diagram illustrating the magnitude relationship and the positional relationship in a winding axis direction between capacitor electrodes C10a to C10e of the resonant circuit capacitor C10 and the primary coil L1 and the secondary coil L2.

FIG. 12 is a diagram illustrating the magnitude relationship and the positional relationship between the conductive patterns of the primary coil L1 and the secondary coil L2 and the electrodes of the resonant circuit capacitor C10. FIG. 13 is a diagram illustrating the magnitude relationship and the positional relationship in the winding axis direction between the capacitor electrodes C10a to C10e of the resonant circuit capacitor C10 and the primary coil L1 and the secondary coil L2. Referring to FIG. 13, broken lines schematically illustrate the magnetic flux contributing to the magnetic coupling between the primary coil L1 and the secondary coil L2.

Referring to FIG. 12, an average conductive pattern of the conductive patterns of the primary coil L1 and the conductive patterns of the secondary coil L2 is represented by LA. Among the multiple capacitor electrodes of the resonant circuit capacitor C10, the capacitor electrodes C10a, C10c, and C10e having large areas are illustrated in FIG. 12.

As described above, the capacitor electrodes of the resonant circuit capacitor C10 are between the second inductor L10 and the primary coil L1 and the secondary coil L2, and the capacitor electrodes C10a, C10c, and C10e of the resonant circuit capacitor C10 cover the coil opening of the primary coil of the conductive patterns L1a to L1d and the coil opening of the secondary coil of conductive patterns L2a to L2d, viewed in the winding axis direction (the Z-axis direction). Accordingly, unnecessary magnetic coupling (inductive coupling) between the second inductor L10 and the primary coil L1 and the secondary coil L2 is reduced or prevented. In addition, since the capacitor electrodes C10a, C10c, and C10e of the resonant circuit capacitor C10 are grounded, the parasitic capacitance (capacitive coupling) occurring between the primary coil L1 and the secondary coil L2 and the second inductor L10 is reduced or prevented.

Figure 14:
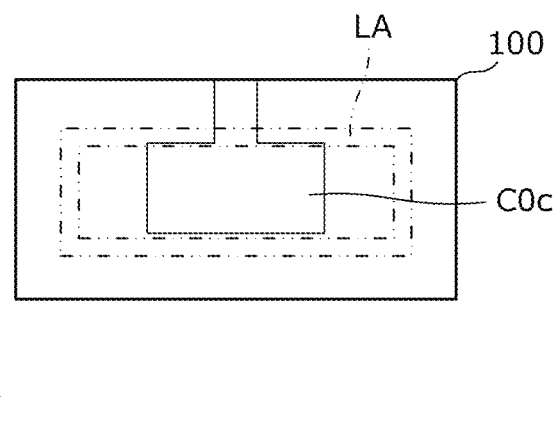
FIG. 14 is a diagram illustrating the magnitude relationship and the positional relationship between the conductive patterns of the primary coil L1 and the secondary coil L2 and a capacitor electrode C0c defining a portion of a capacitor-between-input-and-output C0.
Figure 15:
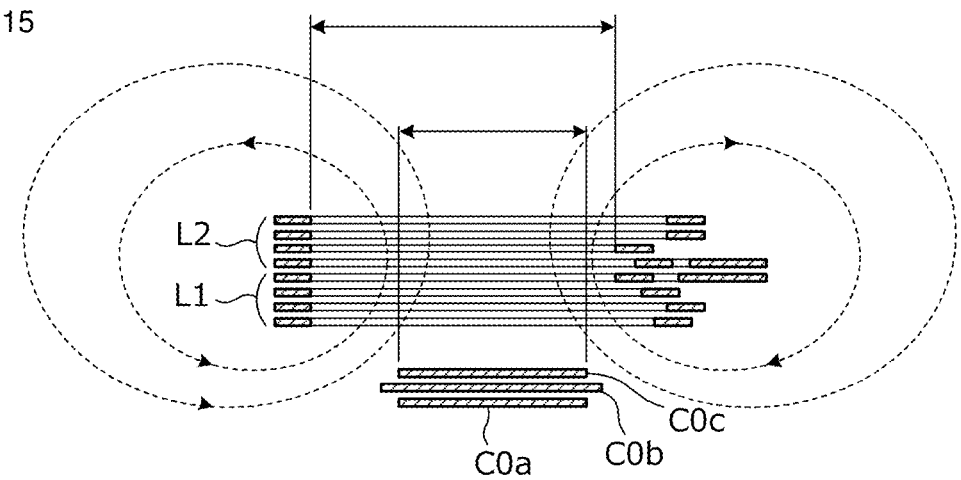
FIG. 15 is a diagram illustrating the magnitude relationship and the positional relationship in the winding axis direction between capacitor electrodes C0a, C0b, and C0c of the capacitor-between-input-and-output C0 and the primary coil L1 and the secondary coil L2.
Figure 15:
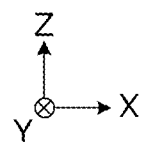

FIG. 14 is a diagram illustrating the magnitude relationship and the positional relationship between the conductive patterns of the primary coil L1 and the secondary coil L2 and the capacitor electrode C0c defining a portion of the capacitor-between-input-and-output C0. FIG. 15 is a diagram illustrating the magnitude relationship and the positional relationship in the winding axis direction between the capacitor electrodes C0a, C0b, and C0c of the capacitor-between-input-and-output C0 and the primary coil L1 and the secondary coil L2. Referring to FIG. 15, broken lines schematically illustrate the magnetic flux contributing to the magnetic coupling between the primary coil L1 and the secondary coil L2.

Referring to FIG. 14, the schematic conductive pattern is represented by LA. The schematic conductive pattern LA is an area covered by one of the primary coil L1 and the secondary coil L2, viewed in the winding axis direction (the Z-axis direction). Among the capacitor electrodes C0a, C0b, and C0c of the capacitor-between-input-and-output C0, the capacitor electrode C0c closest to the primary coil L1 and the secondary coil L2 is fit within the coil openings of the primary coil L1 and the secondary coil L2, viewed in the winding axis direction. In other words, the capacitor electrode C0c is fit within the opening of the schematic conductive pattern LA.

As described above, the capacitor electrodes of the capacitor-between-input-and-output C0 are positioned between the primary coil L1 and the secondary coil L2 and the resonant circuit capacitor C10 and, among the multiple capacitor electrodes of the capacitor-between-input-and-output C0, the capacitor electrode C0c closest to the primary coil L1 and the secondary coil L2 is fit within the coil openings of the primary coil L1 and the secondary coil L2, viewed in the winding axis direction (the Z-axis direction). Accordingly, the path of the magnetic flux linking to the primary coil L1 and the secondary coil L2 is not blocked by the capacitor electrode C0c. In other words, since the area of the capacitor electrode C0c is smaller than the coil opening areas of the primary coil L1 and the secondary coil L2, the capacitor electrode C0c does not cover the entire coil openings and does not block the magnetic flux passing through the coil openings of the primary coil L1 and the secondary coil L2. Accordingly, high magnetic coupling is maintained between the primary coil L1 and the secondary coil L2.

Figure 16:
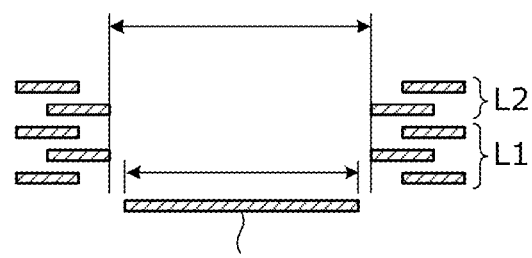
FIG. 16 is another diagram illustrating the magnitude relationship and the positional relationship in the winding axis direction between the capacitor electrode C0c defining a portion of the capacitor-between-input-and-output C0 and the primary coil L1 and the secondary coil L2.
Figure 16:
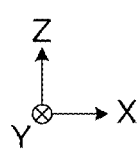

FIG. 16 is another diagram illustrating the magnitude relationship and the positional relationship in the winding axis direction between the capacitor electrode C0c defining a portion of the capacitor-between-input-and-output C0 and the primary coil L1 and the secondary coil L2. Although most of the internal diameters and the external diameters of the coil conductor patterns of the respective layers of the primary coil L1 are represented as being constant in the examples illustrated in FIG. 13 and FIG. 15, the capacitor electrode C0c is preferably fit within the most internal diameter, viewed in the winding axis direction (the Z-axis direction), when the internal diameters and the external diameters of the coil conductor patterns of the respective layers of the primary coil L1 are varied, as illustrated in FIG. 16.

In the example illustrated in FIG. 11, the positions where the conductive patterns L1a to L1d of the primary coil L1 are provided and the positions where the conductive patterns L2a to L2d of the secondary coil L2 are provided are not isolated from each other and are partially overlapped with each other. In other words, the conductive pattern L2d is between the conductive pattern L1c and the conductive pattern L1d and the conductive pattern L1d is between the conductive pattern L2c and the conductive pattern L2d. Since a portion of the conductive patterns, which are the components of the primary coil L1, is sandwiched between the conductive patterns, which are the components of the secondary coil L2, and a portion of the conductive patterns, which are the components of the secondary coil L2, is sandwiched between the conductive patterns, which are the components of the primary coil L1, as described above, the total area where the conductive patterns of the primary coil are opposed to the conductive patterns of the secondary coil is increased to enable the capacitance occurring between the primary coil L1 and the secondary coil L2 to be easily increased. Accordingly, the capacitor-between-input-and-output C0 is required to have a small area.

Second Preferred Embodiment

In a second preferred embodiment of the present invention, a filter circuit module differing from the example described in the first preferred embodiment in the shape of the second inductor is described.

Figure 17A:
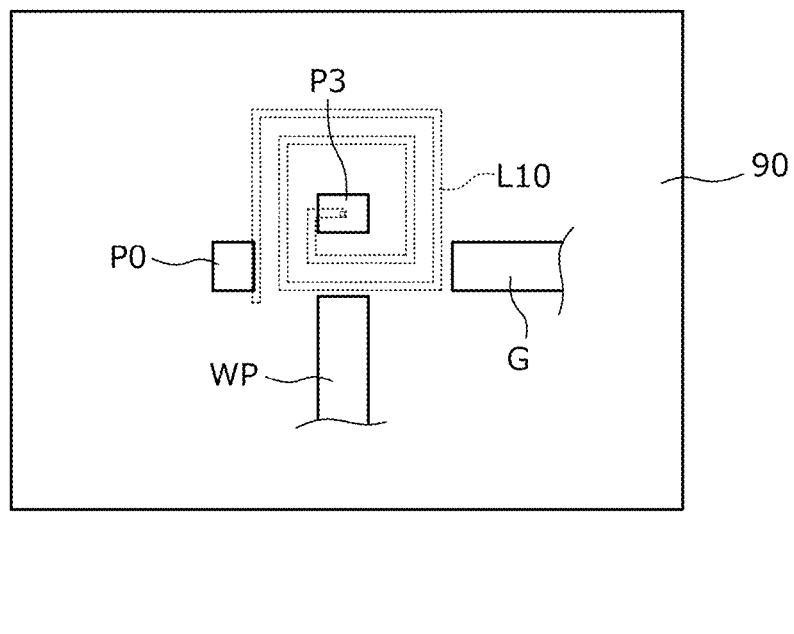
FIG. 17A is a plan view of the circuit board 90, which shows the configuration of the mounting portion of the filter circuit element 101 in a filter circuit module according to a second preferred embodiment of the present invention.
Figure 17B:
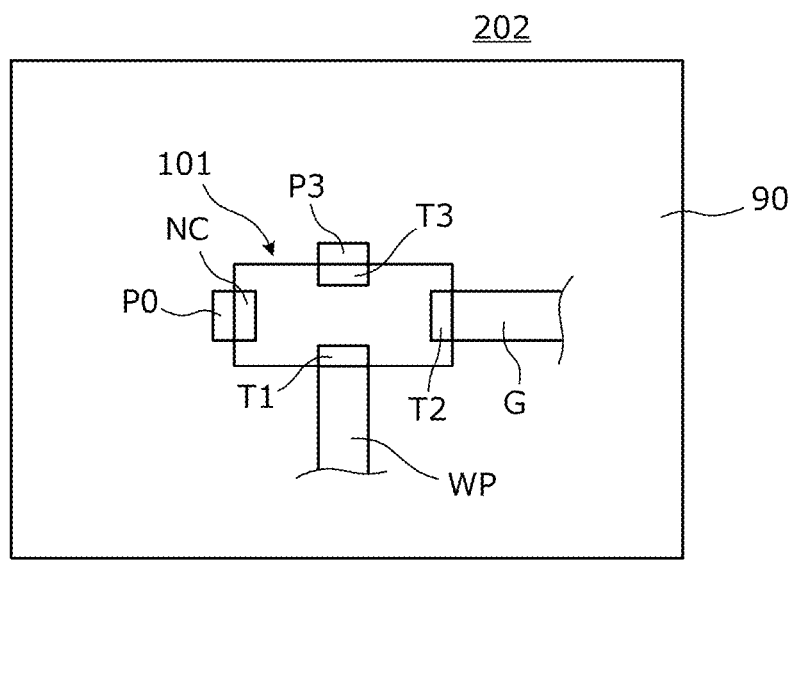
FIG. 17B is a plan view of a filter circuit module 202 with the filter circuit element 101 mounted on the circuit board 90.

FIG. 17A is a plan view of the circuit board 90, which shows the configuration of the mounting portion of the filter circuit element 101. FIG. 17B is a plan view of a filter circuit module 202 with the filter circuit element 101 mounted on the circuit board 90.

The wiring pattern WP, the ground electrode G, the mounting pads P0 and P3, and the like, for example, are provided on the top surface of the circuit board 90. The second inductor L10 is provided in the circuit board 90. The second inductor L10 is defined by a rectangular or substantially rectangular spiral conductive pattern. One end of the second inductor L10 is connected to the mounting pad P3 and the other end of the second inductor L10 is connected to the ground conductor in the circuit board 90. The wiring pattern WP is connected to the signal line SL illustrated in FIG. 7. The shape of the conductive pattern of the second inductor L10 is not limited this example and the conductive pattern of the second inductor L10 may have a circular or substantially circular spiral shape or a meander shape, for example.

As illustrated in FIG. 17B, in a state in which the filter circuit element 101 is mounted on the circuit board 90, the input-output terminal T1 is connected to an end portion of the wiring pattern WP, the input-output terminal T3 is connected to the mounting pad P3, the input-output terminal T2 is connected to the ground electrode G, and the free terminal NC is connected to the mounting pad P0. The filter circuit element 101 has the configuration illustrated in the first preferred embodiment.

In the filter circuit module 202 of the present preferred embodiment, the planar size of the second inductor L10 is much larger than the mounting size of the filter circuit element 101. In addition, in the present preferred embodiment, the coil winding axis of the second inductor L10 does not coincide with the coil winding axes of the primary coil L1 and the secondary coil L2 in the filter circuit element 101. However, the coil winding axis of the second inductor L10 is parallel or substantially parallel to the coil winding axes of the primary coil L1 and the secondary coil L2.

Even with such a configuration, the same or substantially the same advantageous effects and advantages as those of the filter circuit module described in the first preferred embodiment are achieved. With reference to FIG. 11, which is a bottom view of the respective base materials of the filter circuit element 101, specifically, the capacitor electrode of the capacitor-between-input-and-output C0, such as the capacitor electrode C0c, which is fit within the diameters of the coil openings, that is, which has an area smaller than the coil opening areas, exists between the second inductor L10 and the primary coil L1 and the secondary coil L2. Due to such a capacitor electrode, the capacitor-between-input-and-output is capable of being provided without impeding the magnetic coupling. In addition, the filter circuit element 101 includes the capacitor electrode of the resonant circuit capacitor, such as the capacitor electrode C10a of the resonant circuit capacitor C10, which is not fit within the diameters of the coil openings, that is, which has an area larger than the coil opening areas. Since such a capacitor electrode covers the coil opening of the primary coil of the conductive patterns L1a to L1d and the coil opening of the secondary coil of the conductive patterns L2a to L2d, viewed in the winding axis direction (the Z-axis direction), unnecessary magnetic coupling between the primary coil L1 and the secondary coil L2 and the second inductor L10 is reduced or prevented.

Third Preferred Embodiment

In a third preferred embodiment of the present invention, a filter circuit element including a resonant circuit inductor is described.

Figure 18:
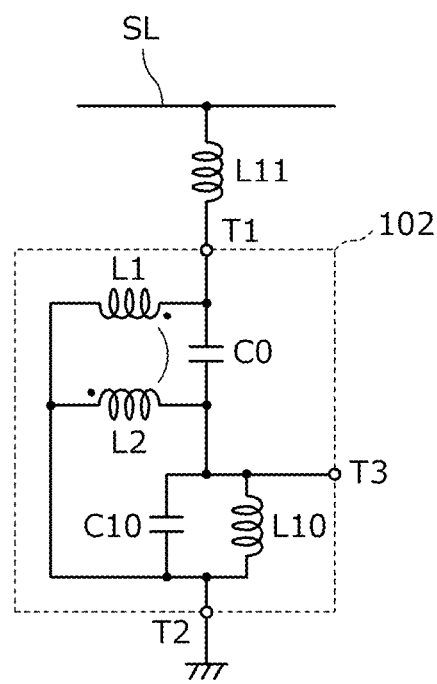
FIG. 18 is a circuit diagram of a filter circuit element 102 according to a third preferred embodiment of the present invention and the filter circuit module 201 including the filter circuit element 102.

FIG. 18 is a circuit diagram of a filter circuit element 102 according to the third preferred embodiment and the filter circuit module 201 including the filter circuit element 102.

In the filter circuit element 102, the primary coil L1, the secondary coil L2, the capacitor-between-input-and-output C0, the resonant circuit capacitor C10, and the resonant circuit inductor L10 are provided as a single component. The resonant circuit inductor L10 corresponds to the second inductor L10 in the first and second preferred embodiments. The external appearance of the filter circuit element 102 is the same or substantially the same as the one illustrated in FIG. 8.

Figure 19:
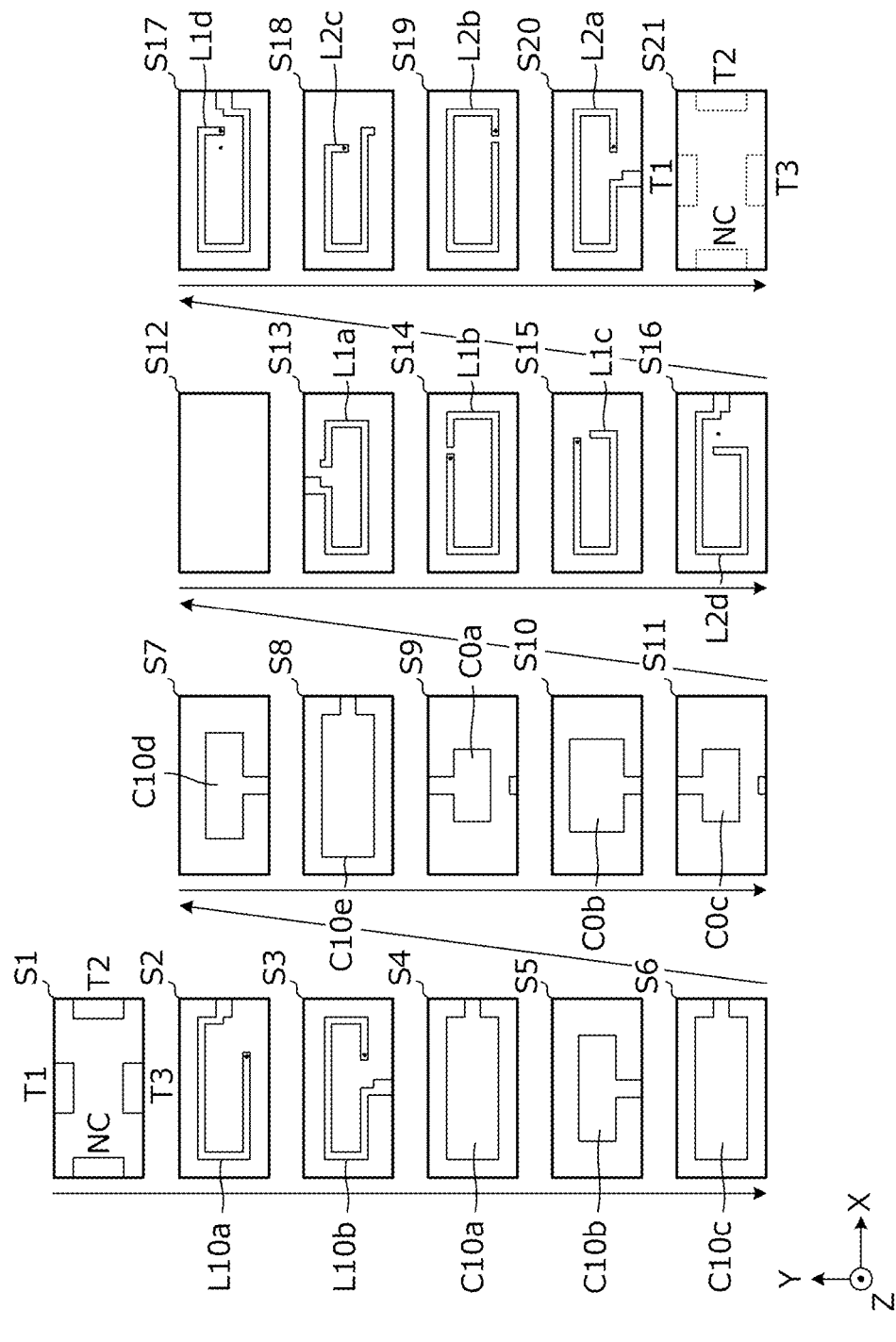
FIG. 19 is a bottom view of the respective base materials of the filter circuit element 102.

FIG. 19 is a bottom view of the respective base materials of the filter circuit element 102. The filter circuit element 102 includes multiple insulating base materials S1 to S21. The base materials S1 to S21 are laminated to define the multilayer body.

The base material S1 corresponds to the bottom surface of the multilayer body (the mounting surface on which the filter circuit element 102 is mounted). The input-output terminals T1, T2, and T3 and the free terminal NC are provided on the base material S1.

Conductive patterns L10a and L10b of the resonant circuit inductor L10 are provided on the base materials S2 and S3, respectively. A first end of the conductive pattern L10a is connected to the input-output terminal T2 and a second end of the conductive pattern L10a is connected to a first end of the conductive pattern L10b via the interlayer connection conductor. A second end of the conductive pattern L10b is connected to the input-output terminal T3.

The configuration of the base material S1 and S4 to S21 is the same or substantially the same as the configuration of the base materials S1 to S19 illustrated in FIG. 11 in the first preferred embodiment.

In the first and second preferred embodiments, the resonant circuit inductor L10 is provided in the circuit board 90, as illustrated in FIG. 9A and FIG. 17A. However, since the filter circuit element 102 including the resonant circuit inductor L10 is provided in the third preferred embodiment, it is not necessary to provide the resonant circuit inductor L10 in the circuit board 90.

The resonant frequency of the LC parallel resonant circuit of the resonant circuit capacitor C10 and the resonant circuit inductor L10 is capable of being adjusted by connecting a capacitor or an inductor between the input-output terminals T2-T3. In addition, the Q value of the resonance of the LC tank circuit of the resonant circuit capacitor C10 and the resonant circuit inductor L10 is capable of being adjusted by connecting a resistive element between the input-output terminals T2-T3. In other words, providing a capacitor having predetermined capacitance or an inductor having predetermined inductance in or on the circuit board enables the resonant frequency of the LC parallel resonant circuit in the filter circuit element 102 to be mounted on the circuit board 90 to be fine-tuned. In addition, providing a resistive element having predetermined resistance in or on the circuit board 90 enables the Q value of the resonance of the LC parallel resonant circuit in the filter circuit element 102 to be mounted on the circuit board 90 to be fine-tuned.

All of the capacitor, the inductor, and the resistive element to be provided in or on the circuit board 90 may be provided by forming the conductive patterns in the circuit board 90 or may be provided by mounting the elements on the circuit board 90.

The same advantageous effects and advantages as those in the above preferred embodiments are achieved even when the resonant circuit inductor L10 is included in the filter circuit element 102, as in the present preferred embodiment. In other words, fitting the capacitor electrode (for example, the capacitor electrode C0c) of the capacitor-between-input-and-output C0 within the diameters of the coil openings of the primary coil L1 and the secondary coil L2 (that is, providing the capacitor electrode having an area smaller than the coil opening areas of the primary coil L1 and the secondary coil L2) enables the capacitor-between-input-and-output C0 to be provided without impeding the magnetic coupling between the primary coil L1 and the secondary coil L2.

In the present preferred embodiment, the capacitor electrode (for example, the capacitor electrode C10a) of the resonant circuit capacitor C10, which is not fit within the diameters of the coil openings of the primary coil L1 and the secondary coil L2 (which has an area larger than the coil opening areas of the primary coil L1 and the secondary coil L2), exists between the resonant circuit inductor L10 and the primary coil L1 and the secondary coil L2. Accordingly, the coil opening of the primary coil of the conductive patterns L1a to L1d and the coil opening of the secondary coil of the conductive patterns L2a to L2d are covered with the capacitor electrode of the resonant circuit capacitor C10, viewed in the winding axis direction (the Z-axis direction). This reduces or prevents unnecessary magnetic coupling between the resonant circuit inductor L10 and the primary coil L1 and the secondary coil L2.

When no element or no conductive pattern for setting the resonant frequency of the resonant circuit is externally provided, it is not necessary to provide the input-output terminal T3 illustrated in FIG. 18.

Fourth Preferred Embodiment

In a fourth preferred embodiment of the present invention, an example of the configuration of a communication apparatus including the filter circuit module is described.

Figure 20:
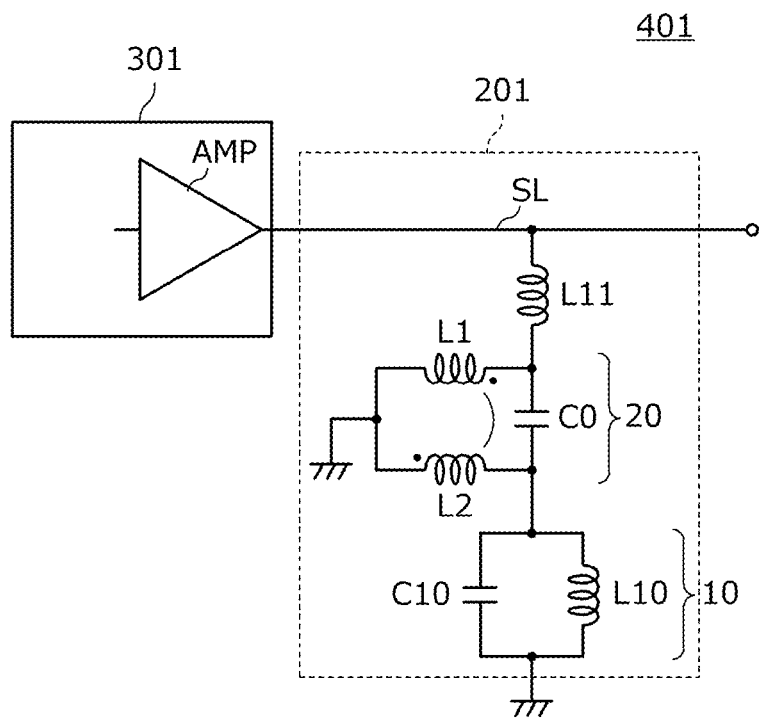
FIG. 20 is a circuit diagram of a main portion of a communication apparatus 401 according to a fourth preferred embodiment of the present invention.

FIG. 20 is a circuit diagram of the main portion of a communication apparatus 401. The communication apparatus 401 includes a radio-frequency circuit 301 and the filter circuit module 201 connected to a radio-frequency signal line of the radio-frequency circuit 301.

Specifically, the signal line SL of the filter circuit module 201 is connected to the radio-frequency signal line of the radio-frequency circuit 301, and the first inductor L11, the phase-shift circuit 20, and the LC parallel resonant circuit 10 are connected between this signal line and the ground. The radio-frequency circuit 301 includes a radio-frequency amplifier circuit AMP that outputs the radio-frequency signal to the signal line.

The filter circuit module 201 attenuates the 2.4-GHz noise components superimposed on the signal line SL. The radio-frequency amplifier circuit AMP generates an unnecessary harmonic signal while the filter circuit module 201 transmits the fundamental wave components with low loss to attenuate the harmonic components described above.

Finally, the description of the above preferred embodiments is only by way of example and the above preferred embodiments are not limited to the description. Modifications and changes are appropriately available for the persons skilled in the art. The scope of the present invention is indicated not by the above preferred embodiments but by the scope of the claims. In addition, changes from the preferred embodiments within the scope of the claims and the equivalent scope are included in the scope of the present invention.

For example, although the example is described in the respective preferred embodiments described above in which the ratio of the number of turns of the primary coil L1 to the number of turns of the secondary coil L2 is 1:1, the ratio of the number of turns of the primary coil L1 to the number of turns of the secondary coil L2 may be 1:n (n is not one).

Aspects disclosed in the preferred embodiments of the present invention described above will be exemplified.

A filter circuit module 201, 202 according to a preferred embodiment of the present invention includes a filter circuit element 101, 102 provided in a multilayer body 100 including multiple base material layers S1 to S21 including a base material layer with a conductive pattern provided thereon and a circuit board 90 with the filter circuit element mounted thereon.

The filter circuit element 101, 102 includes a resonant circuit capacitor C10, which is a portion of an LC parallel resonant circuit 10, and a phase-shift circuit 20.

The circuit board 90 is provided with a second inductor L10.

The phase-shift circuit 20 includes a primary coil L1, a secondary coil L2, and a capacitor-between-input-and-output C0. The primary coil L1 is magnetically coupled to the secondary coil L2.

The LC parallel resonant circuit 10 includes the second inductor L10 and the resonant circuit capacitor C10 connected in parallel to the second inductor L10.

The capacitor-between-input-and-output C0 is connected between a first end of the primary coil L1 and a first end of the secondary coil L2.

The first end of the primary coil L1 is connected to the first inductor L11.

A second end of the primary coil L1 is connected to a second end of the secondary coil L2.

A first end of the resonant circuit capacitor C10 is connected to the first end of the secondary coil L2.

A second end of the resonant circuit capacitor C10 is connected to the second end of the secondary coil L2.

The second inductor L10 includes a coil with a winding axis WA, which is provided in the circuit board 90.

The primary coil L1 and the secondary coil L2 are overlapped with the second inductor L10, viewed in a direction of the winding axis WA.

The resonant circuit capacitor C10 is closer to a mounting surface on which the filter circuit element is mounted on the circuit board 90, compared with the primary coil L1 and the secondary coil L2.

The resonant circuit capacitor C10 is includes multiple capacitor electrodes C10a to C10e and the multiple capacitor electrodes C10a to C10e include the capacitor electrodes C10a, C10c, and C10e covering a coil opening of the primary coil L1 and a coil opening of the secondary coil L2, viewed in the direction of the winding axis WA.

In a preferred embodiment of the present invention, the first inductor L11 is a wiring pattern provided in the circuit board 90. With this configuration, it is not necessary to provide the inductor, which is a component, so as to reduce the filter circuit module in size.

In a preferred embodiment of the present invention, the first inductor L11 is an inductor element mounted on the circuit board 90. With this configuration, it is possible to provide the inductor element having a relatively high inductance value. In addition, unnecessary coupling with another coil or inductor is easily reduced or prevented.

In a preferred embodiment of the present invention, the capacitor-between-input-and-output C0 includes multiple capacitor electrodes C0a, C0b, and C0c and the capacitor electrodes C0a, C0b, and C0c are positioned between the primary coil L1 and the secondary coil L2 and the resonant circuit capacitor C10.

Among the multiple capacitor electrodes C0a, C0b, and C0c for the capacitor-between-input-and-output C0, the capacitor electrode C0c closest to the primary coil L1 and the secondary coil L2 is fit within the coil openings of the primary coil L1 and the secondary coil L2, viewed in the direction of the winding axis WA.

With this configuration, the multiple capacitor electrodes C0a, C0b, and C0c for the capacitor-between-input-and-output C0 are positioned between the primary coil L1 and the secondary coil L2 and the resonant circuit capacitor C10 and, among the multiple capacitor electrodes C0a, C0b, and C0c for the capacitor-between-input-and-output C0, the capacitor electrode C0c closest to the primary coil L1 and the secondary coil L2 is fit within the coil openings of the primary coil L1 and the secondary coil L2, viewed in the winding axis direction (the Z-axis direction). Accordingly, the path of the magnetic flux linking to the primary coil L1 and the secondary coil L2 is not blocked by the capacitor electrode C0c. Consequently, high magnetic coupling is maintained between the primary coil L1 and the secondary coil L2.

In a preferred embodiment of the present invention, areas of all of the multiple capacitor electrodes C0a, C0b, and C0c of the capacitor-between-input-and-output C0 are smaller than areas of the coil openings of the primary coil L1 and the secondary coil L2. With this configuration, the path of the magnetic flux linking to the primary coil L1 and the secondary coil L2 is not blocked by the capacitor electrodes C0a, C0b, and C0c. Accordingly, higher magnetic coupling is maintained between the primary coil L1 and the secondary coil L2.

A filter circuit element 101, 102 according to a preferred embodiment of the present invention is provided in a multilayer body 100 including multiple base material layers S1 to S21 including a base material layer with a conductive pattern provided thereon and includes an LC parallel resonant circuit 10 and a phase-shift circuit 20.

The phase-shift circuit 20 includes a primary coil L1, a secondary coil L2, and a capacitor-between-input-and-output C0. The primary coil L1 is magnetically coupled to the secondary coil L2.

The LC parallel resonant circuit 10 includes a resonant circuit inductor L10 and a resonant circuit capacitor C10, which are connected in parallel to each other.

The capacitor-between-input-and-output C0 is connected between a first end of the primary coil L1 and a first end of the secondary coil L2.

A second end of the primary coil L1 is connected to a second end of the secondary coil L2.

A first end of the resonant circuit capacitor C10 is connected to the first end of the secondary coil L2.

A second end of the resonant circuit capacitor C10 is connected to the second end of the secondary coil L2.

The resonant circuit inductor L10 includes a coil with a winding axis WA.

The primary coil L1 and the secondary coil L2 are overlapped with the resonant circuit inductor L10, viewed in a direction of the winding axis WA.

The resonant circuit capacitor C10 is between the coil composing the resonant circuit inductor L10 and the primary coil L1 and the secondary coil L2.

The resonant circuit capacitor C10 includes multiple capacitor electrodes C10a to C10e and the multiple capacitor electrodes C10a to C10e include the capacitor electrodes C10a, C10b, and C10c covering a coil opening of the primary coil L1 and a coil opening of the secondary coil L2, viewed in the direction of the winding axis WA.

A filter circuit according to a preferred embodiment of the present invention includes a filter circuit module according to a preferred embodiment of the present invention or a filter circuit element according to a preferred embodiment of the present invention. The first end of the primary coil and the second end of the resonant circuit capacitor are connected between a signal line and ground.

A communication apparatus according to a preferred embodiment of the present invention includes a radio-frequency circuit 301 and a filter circuit according to a preferred embodiment of the present invention, which is connected to a shunt connection path between a radio-frequency signal line of the radio-frequency circuit 301 and ground.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter circuit module comprising:
   a filter circuit element including a multilayer body including a plurality of base material layers including a base material layer with a conductive pattern provided thereon, a circuit board including the filter circuit element mounted thereon, and a first inductor; wherein
   the filter circuit element includes a resonant circuit capacitor defining a portion of an LC parallel resonant circuit, and a phase-shift circuit;
   the circuit board includes a second inductor;
   the phase-shift circuit includes a primary coil, a secondary coil, and a capacitor-between-input-and-output, the primary coil being magnetically coupled to the secondary coil;
   the LC parallel resonant circuit includes the second inductor and the resonant circuit capacitor connected in parallel to the second inductor;
   the capacitor-between-input-and-output is connected between a first end of the primary coil and a first end of the secondary coil;
   the first end of the primary coil is connected to the first inductor;

a second end of the primary coil is connected to a second end of the secondary coil;
a first end of the resonant circuit capacitor is connected to the first end of the secondary coil;
a second end of the resonant circuit capacitor is connected to the second end of the secondary coil;
the second inductor is provided in the circuit board;
the primary coil and the secondary coil are overlapped with the second inductor, viewed in a laminated direction of the multilayer body;
the resonant circuit capacitor is closer to a mounting surface on which the filter circuit element is mounted on the circuit board, compared with the primary coil and the secondary coil; and
the resonant circuit capacitor includes a plurality of capacitor electrodes, and the plurality of capacitor electrodes include a capacitor electrode covering a coil opening of the primary coil and a coil opening of the secondary coil, viewed in the laminated direction.

2. The filter circuit module according to claim 1, wherein the first inductor is a wiring pattern in the circuit board.

3. The filter circuit module according to claim 1, wherein the first inductor is an inductor element mounted on the circuit board.

4. The filter circuit module according to claim 1, wherein the capacitor-between-input-and-output includes a plurality of capacitor electrodes and the capacitor electrodes are positioned between the primary coil and the secondary coil and the resonant circuit capacitor; and
among the plurality of capacitor electrodes of the capacitor-between-input-and-output, the capacitor electrode closest to the primary coil and the secondary coil is in the coil openings of the primary coil and the secondary coil, viewed in the laminated direction.

5. The filter circuit module according to claim 4, wherein an area of each of the plurality of capacitor electrodes of the capacitor-between-input-and-output is smaller than areas of the coil openings of the primary coil and the secondary coil.

6. A filter circuit element comprising:
a multilayer body including a plurality of base material layers including a base material layer with a conductive pattern provided thereon, and including an LC parallel resonant circuit and a phase-shift circuit; wherein
the phase-shift circuit includes a primary coil, a secondary coil, and a capacitor-between-input-and-output, the primary coil being magnetically coupled to the secondary coil;
the LC parallel resonant circuit includes a resonant circuit inductor and a resonant circuit capacitor, which are connected in parallel to each other;
the capacitor-between-input-and-output is connected between a first end of the primary coil and a first end of the secondary coil;
a second end of the primary coil is connected to a second end of the secondary coil;
a first end of the resonant circuit capacitor is connected to the first end of the secondary coil;
a second end of the resonant circuit capacitor is connected to the second end of the secondary coil;
the resonant circuit inductor includes a coil with a winding axis;
the primary coil and the secondary coil are overlapped with the resonant circuit inductor, viewed in a direction of the winding axis;
the resonant circuit capacitor is between the coil including the resonant circuit inductor and the primary coil and the secondary coil; and
the resonant circuit capacitor includes a plurality of capacitor electrodes, and the plurality of capacitor electrodes include a capacitor electrode covering a coil opening of the primary coil and a coil opening of the secondary coil, viewed in the direction of the winding axis.

7. A filter circuit comprising:
the filter circuit module according to claim 1; wherein
the first end of the primary coil and the second end of the resonant circuit capacitor are connected between a signal line and ground.

8. The filter circuit according to claim 7, wherein the first inductor is a wiring pattern in the circuit board.

9. The filter circuit according to claim 7, wherein the first inductor is an inductor element mounted on the circuit board.

10. The filter circuit according to claim 7, wherein
the capacitor-between-input-and-output includes a plurality of capacitor electrodes and the capacitor electrodes are positioned between the primary coil and the secondary coil and the resonant circuit capacitor; and
among the plurality of capacitor electrodes of the capacitor-between-input-and-output, the capacitor electrode closest to the primary coil and the secondary coil is in the coil openings of the primary coil and the secondary coil, viewed in the laminated direction.

11. The filter circuit according to claim 10, wherein an area of each of the plurality of capacitor electrodes of the capacitor-between-input-and-output is smaller than areas of the coil openings of the primary coil and the secondary coil.

12. A communication apparatus comprising:
a radio-frequency signal line; and
the filter circuit according to claim 7 connected to a shunt connection path between the radio-frequency signal line and ground.

13. The communication apparatus according to claim 12, wherein the first inductor is a wiring pattern in the circuit board.

14. The communication apparatus according to claim 12, wherein the first inductor is an inductor element mounted on the circuit board.

15. The communication apparatus according to claim 12, wherein
the capacitor-between-input-and-output includes a plurality of capacitor electrodes and the capacitor electrodes are positioned between the primary coil and the secondary coil and the resonant circuit capacitor; and
among the plurality of capacitor electrodes of the capacitor-between-input-and-output, the capacitor electrode closest to the primary coil and the secondary coil is in the coil openings of the primary coil and the secondary coil, viewed in the laminated direction.

16. The communication apparatus according to claim 15, wherein an area of each of the plurality of capacitor electrodes of the capacitor-between-input-and-output is smaller than areas of the coil openings of the primary coil and the secondary coil.

17. A filter circuit comprising:
the filter circuit element according to claim 6; wherein
the first end of the primary coil and the second end of the resonant circuit capacitor are connected between a signal line and ground.

18. A communication apparatus comprising:
a radio-frequency signal line; and the filter circuit according to claim 17 connected to a shunt connection path between the radio-frequency signal line and ground.

\* \* \* \* \*